United States Patent
Raisbeck et al.

(10) Patent No.: US 10,513,773 B2
(45) Date of Patent: Dec. 24, 2019

(54) DEPOSITION PROCESS

(71) Applicants: PILKINGTON GROUP LIMITED, Lathom (GB); UNIVERSITY COLLEGE LONDON, London (GB)

(72) Inventors: Deborah Raisbeck, Burscough (GB); Simon James Hurst, Runcorn (GB); Ivan P. Parkin, London (GB); Claire J. Carmalt, London (GB); Joe A. Manzi, London (GB)

(73) Assignees: Pilkington Group Limited, Lathom (GB); University College London, London (GB)

( * ) Notice: Subject to any disclaimer, the term of this patent is extended or adjusted under 35 U.S.C. 154(b) by 0 days.

(21) Appl. No.: 15/550,464

(22) PCT Filed: Feb. 10, 2016

(86) PCT No.: PCT/GB2016/050318
§ 371 (c)(1),
(2) Date: Aug. 11, 2017

(87) PCT Pub. No.: WO2016/132100
PCT Pub. Date: Aug. 25, 2016

(65) Prior Publication Data
US 2018/0230594 A1    Aug. 16, 2018

(30) Foreign Application Priority Data
Feb. 16, 2015   (GB) .................................. 1502574.5

(51) Int. Cl.
*A61K 9/00*      (2006.01)
*C23C 16/40*     (2006.01)
(Continued)

(52) U.S. Cl.
CPC ............ *C23C 16/40* (2013.01); *C03C 17/245* (2013.01); *C03C 17/3417* (2013.01);
(Continued)

(58) Field of Classification Search
CPC ....................................................... C23C 16/40
See application file for complete search history.

(56) References Cited

U.S. PATENT DOCUMENTS 7,691,984 B2   4/2010   Lei et al.
7,723,493 B2   5/2010   Lei et al.
(Continued)

FOREIGN PATENT DOCUMENTS

CN    102093430 A    6/2011
EP     2065364 A1    6/2009
(Continued)

OTHER PUBLICATIONS

Xian Tao et al, Organophosphine/phosphite stabilized disilver(I) methanedisulphonates: synthesis, solid state structures and their potential use as MOCVD precursors, The Royal Society of Chemistry 2011, Dalton Transactions, 2011, 40, 9250-9258.
(Continued)

*Primary Examiner* — Paul W Dickinson
(74) *Attorney, Agent, or Firm* — Marshall & Melhorn, LLC

(57) ABSTRACT

A process for depositing an inorganic material on a substrate, the process comprising, providing a substrate having a surface, providing a precursor mixture comprising a metal sulfonate, and delivering the precursor mixture to the surface of the substrate, wherein the surface of the substrate is at a substrate temperature of above 450° C. and is sufficient to effect decomposition of the metal sulfonate. The inorganic material may include a metal or a metal oxide. The preferred metal sulfonate is metal triflate.

24 Claims, 7 Drawing Sheets

(51) Int. Cl.
  *C03C 17/34* (2006.01)
  *C03C 17/245* (2006.01)
(52) U.S. Cl.
  CPC .. *C03C 2217/214* (2013.01); *C03C 2217/215* (2013.01); *C03C 2217/216* (2013.01)

(56) References Cited

U.S. PATENT DOCUMENTS

| | | | |
|---|---|---|---|
| 7,763,317 B2 | 7/2010 | Blackwell et al. | |
| 8,523,996 B2 | 9/2013 | Kim et al. | |
| 8,536,570 B2 | 9/2013 | Kim et al. | |
| 9,353,433 B2 | 5/2016 | Kim et al. | |
| 2008/0241423 A1 | 10/2008 | Blackwell et al. | |
| 2010/0251936 A1 | 10/2010 | Kim et al. | |
| 2011/0038767 A1* | 2/2011 | Baril | B01L 3/502707 422/503 |
| 2012/0168747 A1 | 7/2012 | Kim et al. | |
| 2012/0240634 A1 | 9/2012 | Sanderson et al. | |
| 2014/0044977 A1 | 2/2014 | Manning et al. | |
| 2015/0017431 A1 | 1/2015 | Wang et al. | |
| 2016/0185807 A1 | 6/2016 | Kanjolia et al. | |

FOREIGN PATENT DOCUMENTS

| | | |
|---|---|---|
| WO | 2012/143707 A1 | 10/2012 |
| WO | 2013/136052 A2 | 9/2013 |
| WO | 2014/193915 A1 | 12/2014 |

OTHER PUBLICATIONS

Xian Tao et al, Syntheses, X-ray structures and CVD studies of trimethylphosphite stabilized silver (I) methanesulfonates, Journal of Arganometallic Chemistry, 2011, vol. 696, Nr: 13, pp. 2681-2684, XP028222021, Elsevier.

European Patent Office, International Search Report and Written Opinion, issued in international application No. PCT/GB2016/050318, dated May 31, 2016, 10 pages, European Patent Office, Rijswijk, Netherlands.

* cited by examiner

DEPOSITION PROCESS

BACKGROUND OF THE INVENTION

The present invention relates to processes for depositing metals and/or metal oxides on substrates and to substrates having metal and/or metal oxide coatings produced by such processes.

Processes used to deposit coatings on substrate surfaces find use in many fields. Methods used to deposit coatings include physical vapour deposition methods such as pulsed laser deposition (PLD) and sputtering or solution based methods such as spray pyrolysis and sol-gel.

US-A-2012/168,747 discloses methods for forming a mixed (e.g. InGaZnO, InZnO or HfInZnO) oxide semiconductor as a thin film and electronic devices including the oxide film using liquid coating methods and subsequent annealing.

US-A-2010/0251,936 discloses a method of fabricating a liquid, especially by sol gel methods, for an oxide thin film for display and electronic devices which includes mixing at least two kinds of dispersoids selected from zinc, indium, gallium, tin or thallium compounds.

One useful method is chemical vapour deposition (CVD) wherein a fluid precursor is delivered to the surface of the substrate in order to deposit the coating. Particular types of CVD include metal organic (MO) CVD, combustion (C) CVD, plasma enhanced (PE) CVD and aerosol-assisted (AA) CVD.

US-A-2008/241,423 relates to formation of non-native films on surfaces of compound semiconductor films, and more particularly relates to the preparation of III-V semiconductor surfaces for deposition and the subsequent deposition of a film by the Atomic Layer Deposition (ALD) method. The methods described involve exposing a III-V semiconductor surface to a triflating or trifluoroacetylating agent to terminate the III-V semiconductor surface with triflate or trifluoroacetate groups.

Tao et al. (Dalton Trans. 2011, 40, p. 9250) disclose disilver methanedisulphonate phosphorus complexes and hot wall MOCVD on oxidised silicon substrates at 395° C. to 450° C.

EP-A-2 065 364 discloses metal containing tridentate β-ketoiminates as metal containing precursors for chemical vapour deposition processes including atomic layer deposition for fabricating conformal metal containing films on substrates such as silicon for use in semiconductor fabrication.

CVD processes have found use in modifying the light transmission, conductive and other properties of e.g. glass. Useful coatings for, in particular, glass substrates, are coatings of metals and/or metal oxide including transparent conductive oxides (TCO). TCO coatings are useful, for example, as transparent electrodes in flat panel displays, solar cells and organic light emitting diodes and as low emissivity coatings on glazings. TCO coating materials include indium tin oxide (ITO), F-doped tin oxide and zinc oxide.

Zinc oxide is a semiconductor material with a direct wide band gap. Thin films of nominally undoped ZnO exhibit n-type conductivity. The conductivity of zinc oxide can be increased by doping with an extrinsic dopant source, such as Al or Ga. An important aspect of successful CVD processes is the precursor. In the case of zinc oxide coatings, a number of zinc precursors have been investigated, with diethyl zinc often being used. Diethyl zinc is volatile and therefore generally suitable for many CVD techniques. Unfortunately, use of diethyl zinc can be problematic because it is reactive.

WO-A-2013/136052 discloses a chemical vapour deposition process using a gaseous mixture containing an alkyl zinc compound and gaseous inorganic oxygen-containing compounds.

US-A-2012/240,634 discloses a CVD process to produce inter alia Ga-doped ZnO using a gaseous zinc-containing compound (e.g. an alkyl zinc compound), an oxygen-containing compound, and an acetonate compound.

SUMMARY OF THE INVENTION

It is an aim of the present invention to address the problems with existing processes.

In a first aspect, the present invention accordingly provides, a process for depositing a metal and/or a metal oxide (usually a metal oxide coating) on a substrate, the process comprising, providing a substrate having a surface, providing a precursor mixture (preferably a fluid mixture) comprising a metal sulfonate, and delivering the precursor mixture to the surface of the substrate, wherein the surface of the substrate is at a substrate temperature sufficient to effect decomposition of the metal sulfonate.

The surface of the substrate will usually be at a substrate temperature of above 450° C. and is sufficient to effect decomposition of the metal sulfonate.

The metal and/or a metal oxide may comprise a metal, a metal oxide or a mixture of metal and metal oxide.

The process usually comprises chemical vapour deposition (CVD).

The process may further comprise a step of at least partially atomizing the precursor mixture before delivering the precursor mixture to the surface of the substrate.

This is advantageous because at least partially atomized precursor mixtures allow the use of solutions of precursors without the precursor needing to be volatile under the conditions of precursor transport and delivery. Thus, a wider range of precursors and components of the precursor mixture may be used, allowing improved tuning of the properties of the metal oxide coating. Thus, the process is preferably aerosol assisted CVD. The precursor mixture may be at least partially atomized using, for example, ultrasonic atomizers, preferably piezo ultrasonic atomizers.

The use of aerosol assisted CVD in combination with the use of a metal sulfonate is also advantageous because metal sulfonates are often soluble or very soluble in a wide range of solvents. Thus, the use of AACVD in combination with a metal sulfonate enables consistent and efficient deposition over a wide range of temperatures without the need to apply relatively high temperatures to the precursor mixture in order to volatilise the metal sulfonate, or the need to maintain the precursor mixture at relatively high temperatures in order to ensure sufficient and consistent carry-over of the metal sulfonate to the zone of deposition of the metal oxide. Avoiding the need for relatively high temperatures is advantageous because it reduces the chance of premature reaction of the metal sulfonate or other components of the precursor mixture.

The metal (M) may be selected from one or more of Zn, Mg, Al, Sb, Cu, Ag, Sn, and In. A preferred metal is Zn because this allows deposition of ZnO coatings. Mg is also advantageous to allow the deposition of Mg containing coatings.

In preferred embodiments, the metal sulfonate may comprise a compound of formula $M(O_3SR)_m$, wherein M is a or the metal, R is a $C_1$ to $C_7$ fluorinated or non-fluorinated hydrocarbyl group and m depends upon the oxidation state of M.

Examples of sulfonates that may be used in the invention include mesylate (methane sulfonate $CH_3SO_3$), esylate (ethane sulfonate $C_2H_5SO_3$), besylate (benzene sulfonate, $C_6H_5SO_3$), or tosylate ($CH_3C_6H_5SO_3$).

Preferred sulfonates are wherein R is $C_nF_{2n+1}$, where n is 1, 2, 3 or 4.

The most preferred metal sulfonate is metal trifluoromethanesulfonate (metal triflate, $M(OTf)_x$ wherein x depends on the oxidation state of M). Thus, preferably, R is $CF_3$.

The process is preferably a chemical vapour deposition (CVD) process. The CVD process may involve heating the precursor mixture to ensure good carry-over during the process and does not require the use of aerosol assisted CVD techniques in order to deposit good coatings.

It is, nevertheless, preferred if the process for depositing a metal and/or a metal oxide, wherein the metal sulfonate is a metal triflate, is aerosol assisted CVD, that is, it is preferred that the process involves at least partially atomizing the precursor mixture containing the metal triflate before delivery to the surface of the substrate. This is advantageous because metal triflates are generally soluble in a number of solvents and use of a metal triflate in combination with AACVD enables the metal triflate to be efficiently carried over to the substrate surface without the need for the use of relatively high temperatures to volatilise the metal triflate or the need for maintaining the precursor mixture at a relatively high temperature to transport the metal triflate to the substrate surface. Generally avoiding high temperatures is advantageous, as discussed above, because it reduces the chance of decomposition before reaching the substrate surface or other pre-reaction of the metal triflate or other components of the precursor mixture.

In the more preferred embodiments of the invention, M is Zn, Al, In, Mg, Cu and/or Ag and R is $CF_3$. The most preferred M is Zn and the most preferred R is $CF_3$.

It is preferred that the metal sulfonate does not contain phosphorus.

Usually, the precursor mixture will further comprise a carrier gas. The most suitable carrier gas is usually nitrogen, although other carrier gases may also be suitable (e.g. Ar).

Preferably, the precursor mixture will further comprise a solvent. The solvent will usually comprise an oxygenated solvent, for example, a $C_1$ to $C_4$ alcohol. The most preferred solvent comprises methanol.

The process may comprise an additional source of oxygen that may be an organic oxygen source (e.g. an ester in particular an ethyl carboxylate, for example, ethyl acetate) and/or oxygen gas.

In some embodiments, it is advantageous if the precursor mixture further comprises a source of a second metal. The source of a second metal may comprise a metal sulfonate (preferably a metal triflate) as discussed above. Additionally or alternatively, other metal containing precursors may be used as the source of the second metal.

A preferred source of a second metal comprises a source of aluminium. This is advantageous, in particular, where the metal sulfonate is a zinc sulfonate because it enables the deposition of aluminium doped ZnO with generally higher conductivity than undoped ZnO.

It is preferred, if the precursor mixture further comprises a source of a second metal, that the process involves at least partially atomizing the precursor mixture containing the metal sulfonate and the source of the second metal before delivery to the surface of the substrate, i.e. that the process is AACVD. This is advantageous because it reduces the chance that the metal sulfonate and the source of a second metal are carried over to the substrate surface in different proportions to the proportions of metal sulfonate and source of a second metal in the precursor mixture, thus generally reducing preferential carry-over of one or other component.

Conveniently, the source of a second metal comprises aluminium acetylacetonate.

The molar ratio in the precursor mixture of the source of second metal to the metal of the metal sulfonate may be in the range 0.01-0.2 (i.e. 0.01 second metal to 1 metal of the metal sulfonate—0.2 second metal to 1 metal of the metal sulfonate), preferably 0.02-0.1, more preferably 0.03-0.1 and most preferably 0.05-0.1. The preferred atom % (at %) of the second metal in the deposited coating is in the range 1 at % to 10 at %, preferably 2 at % to 9 at %, more preferably 5 at % to 9 at % and most preferably 6 at % to 8 at %.

Usually, the substrate temperature will be above 452° C., preferably above 455° C., more preferably above 460° C. and most preferably above 470° C. Preferably, the substrate temperature will be in the range 450° C. to 800° C., more preferably 455° C. to 700° C., still more preferably 460° C. to 700° C., and most preferably 500° C. to 700° C. This range of temperature is appropriate for e.g. metal, especially zinc, triflates and other metal sulfonates.

Generally, analysis of the decomposition temperature (for example, by thermogravimetric (TG) analysis, differential thermal analysis (DTA) and/or differential scanning calorimetry (DSC)) will indicate the appropriate substrate temperature range sufficient to effect decomposition of the metal sulfonate. Thus, in the case of zinc triflate a suitable temperature range may be in the range 500° C. to 700° C. In the case of other metal sulfonates, for example magnesium triflate, a suitable temperature range may be in the range 450° C. to 700° C., preferably above 450° C. to 700° C., more preferably above 460° C. to 700° C.

A sufficiently high temperature is advantageous because it may provide for improved properties of the metal and/or metal oxide coating. Such improved properties include improved crystallinity or structure, and/or improved optical properties (e.g. improved transmission, reflection, controlled haze) and/or electrical properties (especially sheet conductivity where e.g. the metal oxide is a TCO). Furthermore, a sufficiently high temperature is advantageous because it reduces the chance of incomplete reaction and also provides a relatively high growth rate of coatings. Relatively high growth rate is advantageous because it enables coatings of metal oxide of sufficient thickness to be deposited in a fixed period. This may be particularly advantageous wherein the substrate and precursor delivery apparatus are moving relative to one another (e.g. for deposition, on-line, during the float glass production process).

Thus, preferably, the metal and/or metal oxide is deposited to a thickness in the range 400 nm to 700 nm, preferably 500 nm to 600 nm.

In a preferred embodiment, the substrate comprises glass. The substrate may comprise a continuous ribbon of glass. Conveniently, the metal and/or metal oxide coating may be deposited during the float glass production process. The preferred glass substrate is soda lime silica glass.

The surface of the glass substrate may comprise a layer (e.g. comprising silicon oxide) and the metal and/or metal oxide may be deposited on the layer. Such a layer is advantageous because the layer may form a sodium blocking layer from e.g. the glass substrate and/or to modify e.g. the optical properties of the coating. Additional layers may be situated under the layer or the metal and/or metal oxide coating or may be deposited on the metal and/or metal oxide coating.

As discussed above, the present invention enables deposition of metal and/or metal oxide coatings on a substrate surface.

Thus, the present invention provides, in a particular aspect, process for depositing a coating comprising a metal and/or a metal oxide selected from the group consisting of zinc oxide, aluminium oxide, copper oxide, copper metal, indium oxide, and silver metal on a glass substrate, the process comprising, providing a glass substrate having a surface, providing a precursor mixture comprising a metal trifluoromethanesulfonate, wherein the metal is selected from the group consisting of zinc, aluminium, copper, indium, and silver, and delivering the precursor mixture to the surface of the substrate, wherein the surface of the substrate is at a substrate temperature sufficient to effect decomposition of the metal trifluoromethanesulfonate.

It is preferred if the process according to this particular aspect is CVD, optionally aerosol assisted CVD, generally for the reasons discussed above.

Substrates having a coating of metal and/or metal oxide deposited according to the invention find uses in many areas, for example as low emissivity glazings (where the substrate is glass), and in electrode, photovoltaic cells or other uses of e.g. electrically conducting transparent coatings e.g. wherein the metal oxide is zinc oxide.

BRIEF DESCRIPTION OF THE DRAWINGS

The present invention will now be described by way of example only, and with reference to, the accompanying drawings, in which.

DETAILED DESCRIPTION OF THE INVENTION

Figure 1:
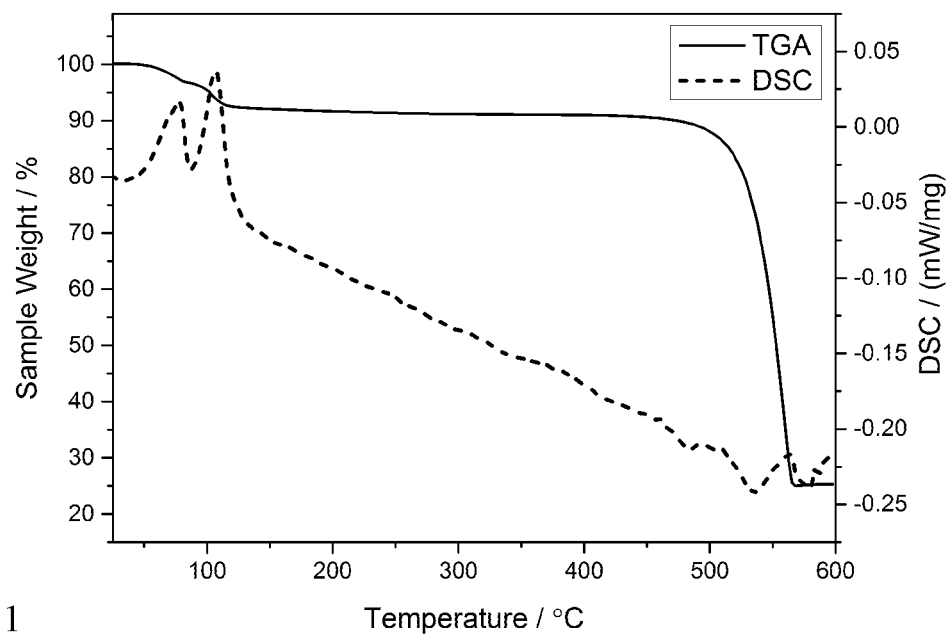
FIG. 1 is a graph showing Thermal Gravimetric Analysis (TGA) and Differential Scanning Calorimetry (DSC) for $Zn(OTf)_2$.

The invention is further illustrated, but not limited, by the following Examples.

EXAMPLES

General Procedures

Nitrogen (99.99%) was obtained from BOC and used as supplied. Metal trifluoromethanesulfonates ($M(OTf)_n$) were obtained from Sigma-Aldrich and aluminium acetylacetonate from Merck Millipore and used as supplied. Methanol was dried over magnesium methoxide and distilled under nitrogen. Precursor solutions were formed in glass bubblers and stirred for 10 minutes. A Liquifog® piezo ultrasonic atomizer was used to vaporise the precursor solution. A homogeneous aerosol of the precursor solution was formed when the concentration of the ultrasonic waves ejected small droplets of precursor solution from the surface of the solution. $N_2$ carrier gas was employed to deliver the aerosol mist from the bubbler, though a brass baffle into the cold-walled, horizontal-bed CVD reactor contained within a quartz tube. Thus, samples were deposited using aerosol assisted chemical vapour deposition (AACVD). The reactor was fitted with a graphite block containing a Whatman cartridge heater, used to heat the glass substrate, the temperature of which was controlled and monitored using a Platinum-Rhodium thermocouple. Films were deposited onto float-glass substrates (145 mm×45 mm×4 mm) (obtained from NSG) having a pre-deposited 25 nm barrier layer of crystalline $SiO_2$. A second glass plate was held 6 mm above the glass substrate in order to reduce any air turbulence and aid in producing a laminar gas flow. Prior to deposition the glass substrate was cleaned using isopropyl alcohol and acetone. After deposition, the glass substrates were allowed to cool under flowing nitrogen to below 100° C. before being removed from the apparatus. After initial investigations the optimal flow rate of $N_2$ and substrate temperature were determined to be 1.21 $min^{-1}$ and 550° C. or 600° C. respectively. Deposition times varied between 30 and 35 minutes.

Film Analysis Methods

Thermal gravimetric analysis (TGA) and differential scanning Calorimetry (DSC) were carried out from room temperature to 600° C. under helium in open aluminum pans using a Netzsch STA 449 C Jupiter Thermo-microbalance.

X-ray diffraction (XRD) patterns were recorded on a Bruker D8 Discover X-ray diffractometer using monochromatic Cu $K\alpha_1$ and Cu $K\alpha_2$ radiation of wavelengths 0.154056 and 0.154439 nm respectively, emitted with a voltage of 40 kV and a current of 40 mA in an intensity ratio of 2:1.

Scanning electron microscopy (SEM) was performed using a Philips XL30 FEG operating in plan and cross section mode at varying instrument magnifications from ×10,000 to ×50,000. Film thickness was estimated using a Filmetrics, Inc. F20 thin film measurement system.

X-ray photoelectron spectroscopy (XPS) surface and depth profiling was performed using a ThermoScientific K-Alpha XPS system using monochromatic Al Kα radiation at 1486.6 eV as X-ray source. Etching was achieved using an Ar ion etch beam at 1 keV with a current of 1.55 μA. 180 levels of 30 second etching were performed. CasaXPS software was used to analyse the data with binding energies referenced to an adventitious C 1s peak at 284.8 eV.

UV/Vis/NIR transmission spectra were recorded using a PerkinElmer Lambda 950 spectrometer in the range of 250-1400 nm with an air background.

Sheet resistance measurements were recorded using the Van der Pauw method and Hall Effect measurements made to determine the mobility and free carrier concentrations of the deposited films.

Examples 1 and 2

ZnO thin films were deposited from a precursor solution of $Zn(OTf)_2$ (0.5 g) dissolved in dry methanol (30 ml). Aluminium doping was achieved by the addition of aluminium acetylacetonate $(Al(acac)_3)$ (0.022 g) to $Zn(OTf)_2$ (0.5 g) in methanol (30 ml).

In Example 1, transparent films of ZnO were deposited by AACVD using $Zn(OTf)_2$ in methanol at 600° C. on $SiO_2$ coated float-glass substrates, according to Scheme 1 (below).

In Example 2, $Al(acac)_3$ was added to the precursor solution and aluminium-doped ZnO (AZO) films were deposited also using AACVD. The level of Al dopant introduced was investigated by adding $Al(acac)_3$ in varying ratios to $Zn(OTf)_2$ of between 0.02-0.2 molar ratio. The best functional properties were observed for AZO films deposited when Al was added in an Al:Zn ratio of 0.05:1. The aluminium doping of these films was found to be 7 at %.

Scheme 1. An overview of the process: the AACVD of ZnO (Example 1) and AZO (Example 2) from the precursors, $Zn(OTf)_2$ and $Al(acac)_3$.

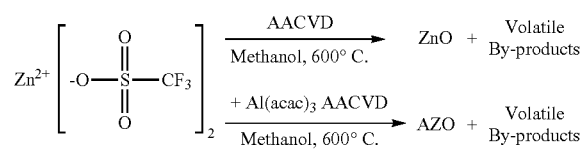

For each reaction, film deposition was observed to occur on the glass substrate. The deposited films were adherent to the glass substrate, passing the Tape Test (could not be removed by applying and removing adhesive tape, e.g. ASTM D3359) but were removed upon scratching with a steel stylus. The films also exhibited good uniformity and coverage of the substrate. Solubility testing of the films indicated that the films were insoluble in organic solvents including THF, ethanol, methanol and toluene but decomposed when in nitric acid.

Precursor Studies

TGA and DSC (FIG. 1) was performed on the $Zn(OTf)_2$ precursor (17 mg) between room temperature (23° C.) and 600° C. under helium. After loss of mass attributed to moisture, the mass is stable until the onset of the decomposition of $Zn(OTf)_2$ occurring at 500° C. A clean decomposition in a single step is observed, predominantly between 520-565° C. The calculated residual mass for ZnO from $Zn(OTf)_2$ is 22.4%. The observed residual mass, accounting for the initial mass loss resulting from residues is 22.7%. This is a strong indication of decomposition to ZnO. From the TGA profile it can be seen that decomposition occurs in a clean one step process to ZnO, showing the suitability of $Zn(OTf)_2$ as a Zn precursor.

Figure 2:
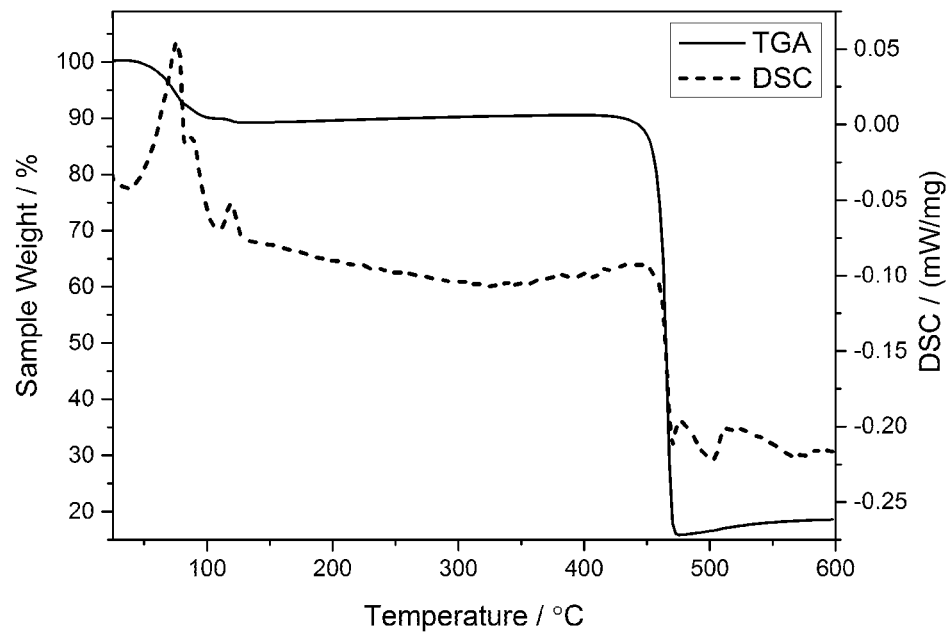
FIG. 2 is a graph showing Thermal Gravimetric Analysis (TGA) and Differential Scanning Calorimetry (DSC) for $Mg(OTf)_2$.

TGA and DSC (FIG. 2) was performed on $Mg(OTf)_2$ precursor between room temperature and 600° C. under helium. A clean decomposition in a single step is observed, predominantly between 450-470° C., at a lower temperature that for zinc triflate. As for zinc triflate, it can be seen from FIG. 2 that decomposition occurs in a clean one step process showing the suitability of $Mg(OTf)_2$ as a Mg precursor.

X-Ray Diffraction

Figure 3:
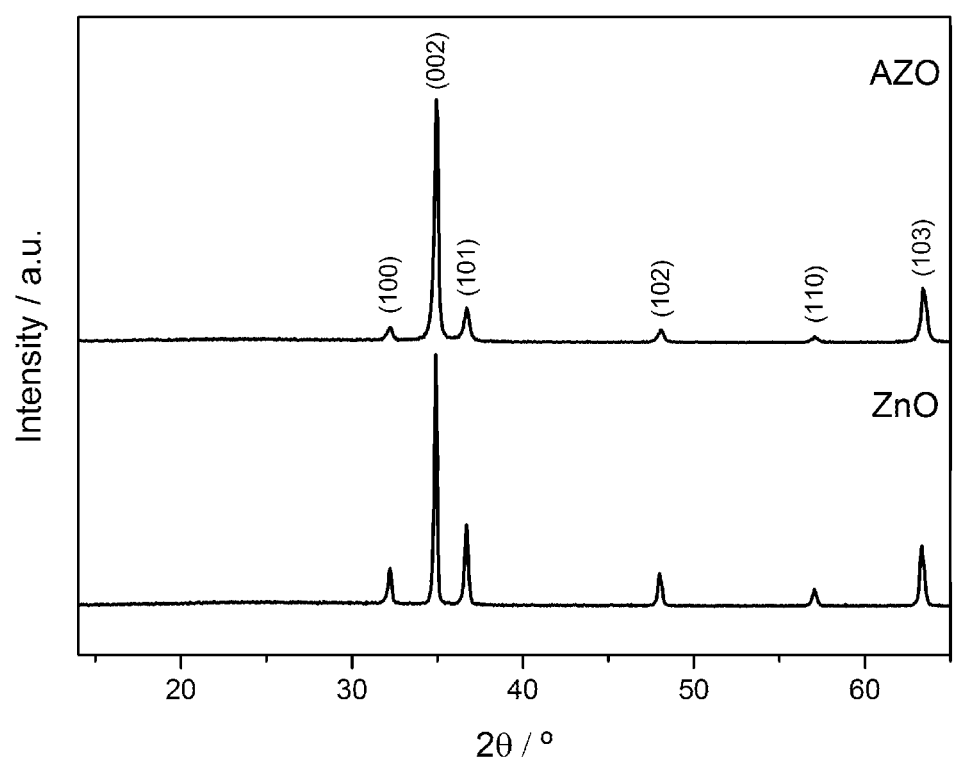
FIG. 3 shows the glancing angle X-ray diffraction (XRD) pattern of the deposited ZnO and aluminium-doped ZnO (AZO) thin films (Examples 1 and 2) according to the invention deposited at 600° C. by aerosol assisted chemical vapour deposition (AACVD) using $Zn(OTf)_2$ in methanol.

Glancing-angle X-ray diffraction (XRD) patterns of the as-deposited films were recorded and are shown in FIG. 3. The reflections for the ZnO film confirm the formation of the hexagonal wurtzite crystal structure of ZnO. Significant preferred orientation was observed along the (002) plane resulting from the packing of the crystallites along the c-axis direction, perpendicular to the underlying substrate. The same crystal structure is also observed for the AZO film. However, upon doping of Al into the ZnO matrix there is a small (up to 0.1°) but observable shifting of the 2θ peak values to a higher value. This shift in 2θ is consistent with all peaks in the pattern and is indicative of Al doping, consistent with EDX and XPS analyses reported below.

Scanning Electron Microscopy

Figure 4:
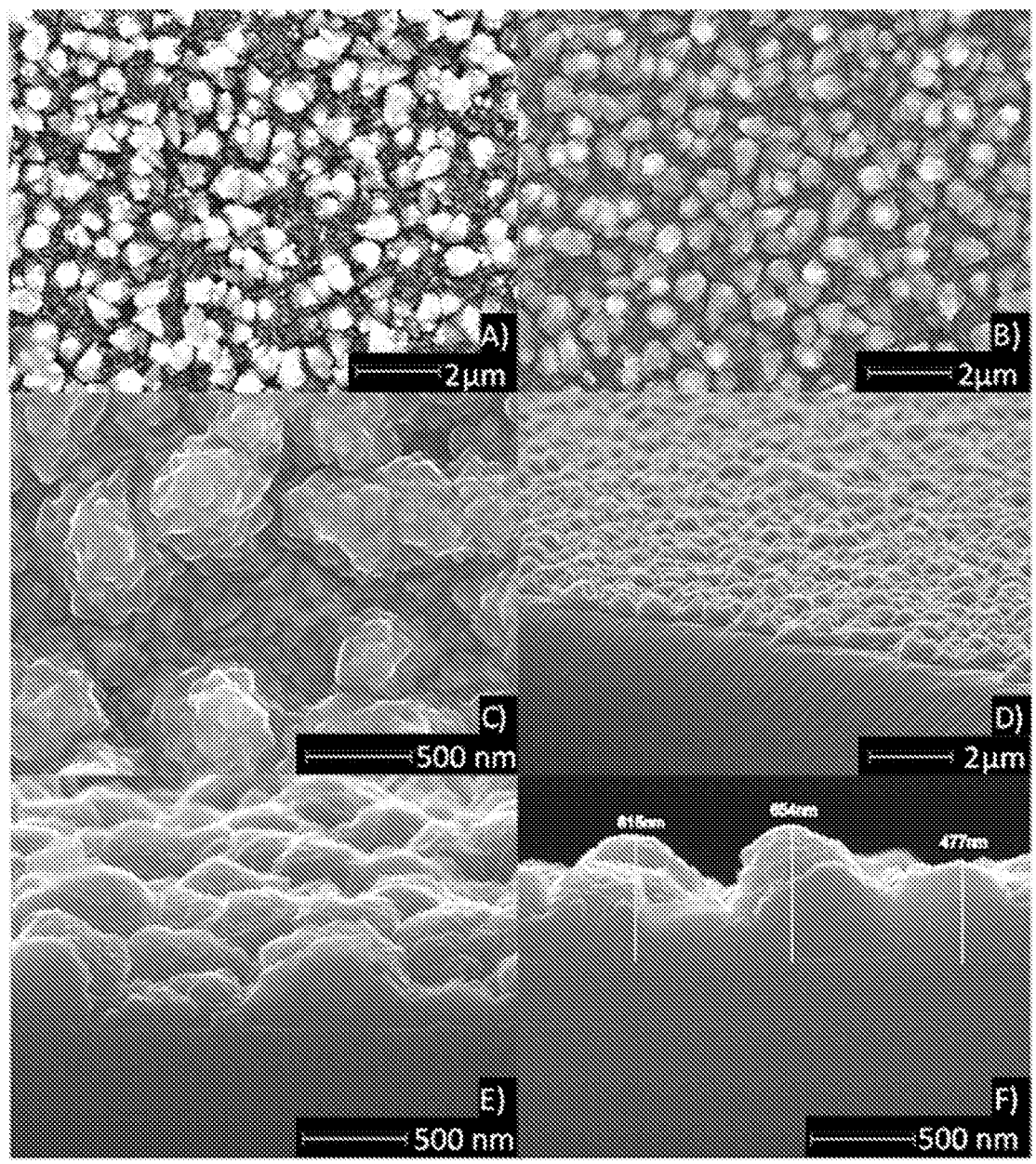
FIG. 4 shows plane views (A-C) and cross section views (D-F) of scanning electron micrographs (SEM images) of (A) ZnO and (B-F) AZO films according to the invention (Examples 1 and 2) deposited at 600° C. by AACVD from $Zn(OTf)_2$ in methanol.

Scanning electron microscopy (SEM) was used to determine surface morphology and height profiles of the deposited films. FIGS. 4(A) and (B) are plane view images at ×10,000 magnification of ZnO and AZO respectively. The images show a film structure of rounded agglomerated particles which is indicative of a Volmer-Weber type island growth mechanism. FIG. 4(C), a plane view image of the AZO film at ×50,000 magnification shows in greater detail the particle cluster growth of the film. The surface morphology of the ZnO films appears not to change upon doping with Al. Cross section images of the films were also taken. FIGS. 4(D) and (E) are cross section images at an 80° tilt at ×10,000 magnification and ×50,000 magnification respectively. These images show the coatings consist of larger agglomerates of particles with smaller groupings of particles between these larger agglomerates. The particle clusters are quite pronounced with noticeable height differences, as shown in FIG. 4(F), a cross section image at 90° tilt at ×50,000 magnification. The lowest thickness of film was 250 nm with the highest cluster point being 655 nm. Film thickness was also measured using a Filmetrics analyzer system and for the AZO films a thickness range of 470-500 nm was recorded. The ZnO films were thicker, 550-570 nm, but had the same pattern of varying heights of agglomerate clusters.

X-Ray Photoelectron Spectroscopy

XPS of the ZnO films deposited from $Zn(OTf)_2$ at 600° C. confirmed the prescence of Zn and O and were consistent with XRD that solely ZnO had been deposited. Peaks were observed for the Zn $2p_{1/2}$ and $2p_{3/2}$ states at 1045.3 and 1022.2 eV binding energy respectively, as expected with an intensity ratio of 1:2 and an energy gap of 23.1 eV. The O 1s peak in the XPS data can be fitted by a Gaussian distribution and centered at 532.0 eV as expected.

For films doped with Al, the Al $2p_{1/2}$ and $2p_{3/2}$ peaks are observed at 75.1 and 74.7 eV respectively. These appear in a 1:2 ratio of intensity with an energy gap of 0.41 eV consistent with the value for $Al^{3+}$ incorporation. The peaks at 1045.7 and 1022.6 eV correspond to Zn $2p_{1/2}$ and $2p_{3/2}$, respectively, again in the 1:2 ratio, with an energy gap of 23.1 eV.

Depth Profiling

Using scan mode, a depth profile for the ZnO and AZO samples were obtained. The argon ion etch beam was operated at 1 keV producing a beam current of 1.55 μA. A 30 second etch time per level was used with 180 levels of total etching. The spectral regions for Zn 2p, O 1s, Al 2p and C 1s were scanned as well as a survey spectrum to detect any additional elements.

Figure 5:
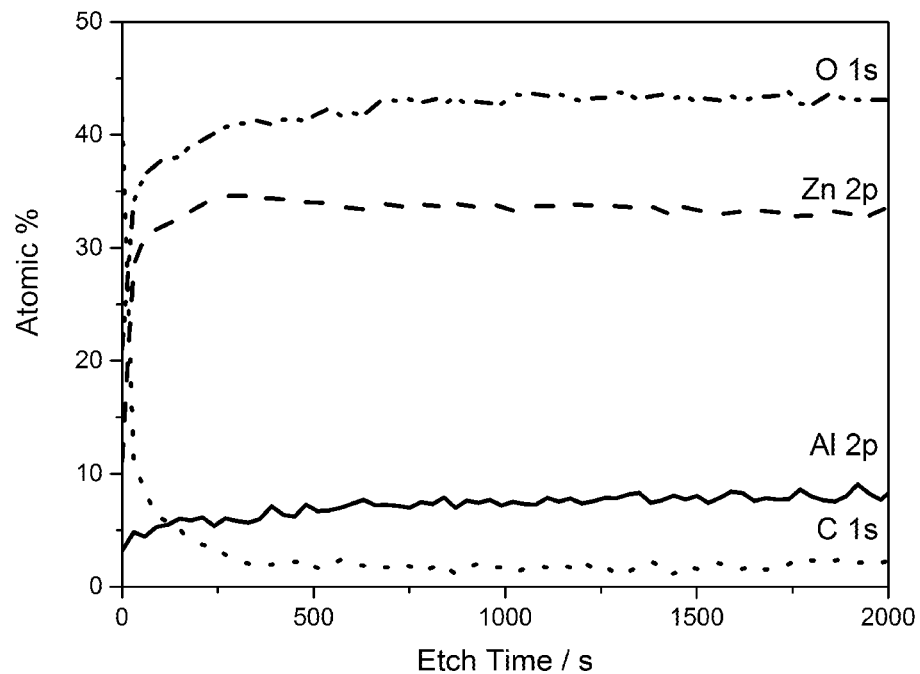
FIG. 5 is an XPS depth profile for an AZO thin film according to the invention (Example 2) deposited at 600° C. by AACVD from $Zn(OTf)_2$ in methanol.

The depth profile for AZO films deposited from $Zn(OTf)_2$ and $Al(acac)_3$ at 600° C., shown in FIG. 5 reveals the sample to be predominantly zinc oxide with an average stoichiometry of $ZnO_{1.2}$. The coating was aluminium doped with an average concentration of 7 at % Al.

Optical Properties

Figure 6:
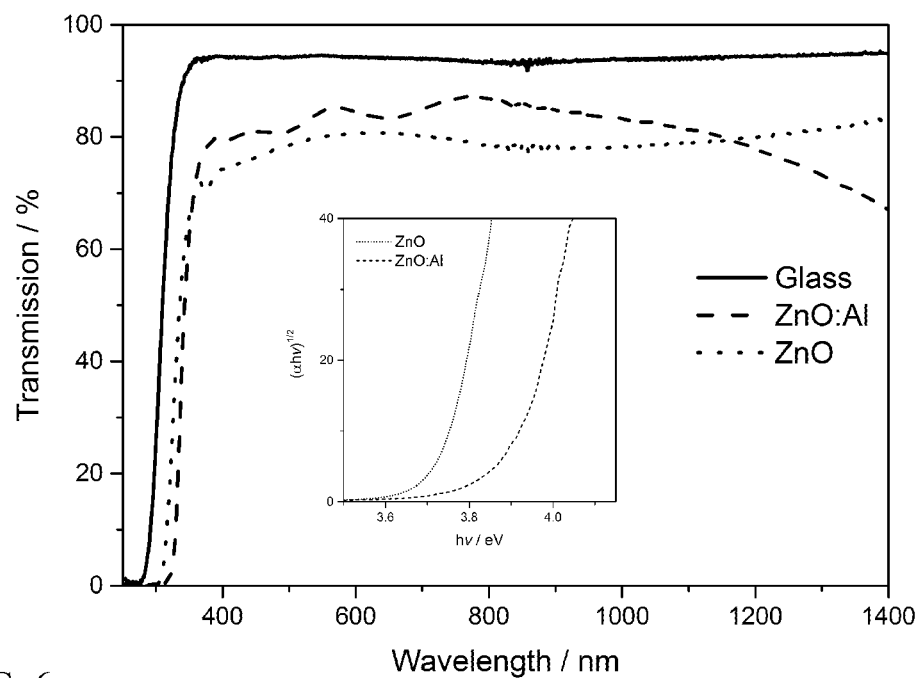
FIG. 6 is the transmission spectrum for ZnO and AZO films (Examples 1 and 2) according to the invention deposited at 600° C. by AACVD from $Zn(OTf)_2$ in methanol recorded between 250 and 1400 nm. Inset: Tauc plots for the ZnO and AZO films.

The transmission characteristics of the ZnO and AZO films were investigated using UV/vis/near IR spectrometry, recorded between 250 and 1400 nm. The absorption edge of each deposited film shifts to higher wavelength relative to the float glass substrate, as shown in FIG. 6. The ZnO film has an average transparency of 79%, peaking at 80%. The AZO film was found to have a slightly higher average transparency at 83%, peaking at 85%. The AZO film has a transparency greater than the 80% in the visible light region, a value often quoted for films described as highly transparent.

The band gap of the ZnO and AZO films were determined from the Tauc plot (inset in FIG. 6) to be 3.7 and 3.9 eV respectively.

Electrical Properties

Four-point probe measurements were taken of the ZnO and AZO films deposited at 600° C. The films were conductive with sheet resistances of 70 Ω/sq. for ZnO, decreasing to 15 Ω/sq. for the AZO film doped with 7 at % of Al. The ZnO films had a carrier concentration of $2.24 \times 10^{20}$ $cm^{-3}$, mobility value of 9.3 $cm^2$ $(V\ s)^{-1}$ and resistivity of $2.86 \times 10^{-3}$ Ωcm. The doped AZO films had an increased carrier concentration and mobility of $3.03 \times 10^{20}$ $cm^{-3}$ and 10.5 $cm^2$ $(V\ s)^{-1}$ respectively resulting in a decrease in the observed resistivity to $1.96 \times 10^{-3}$ Ωcm.

Example 3

Figure 7:
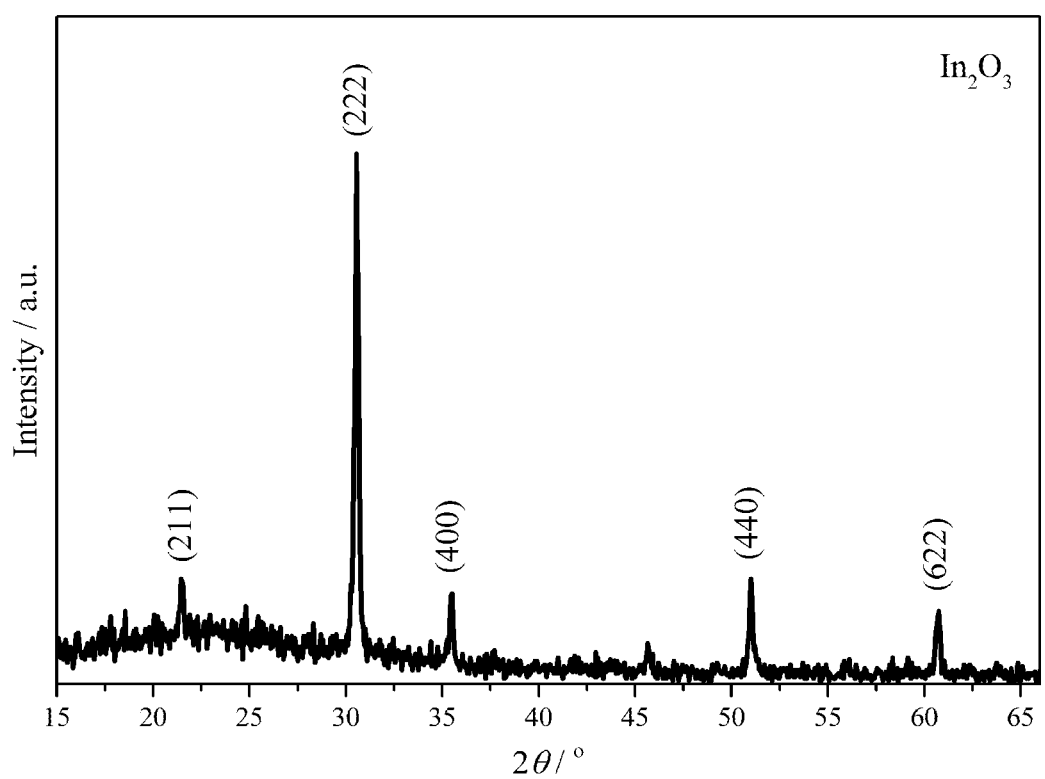
FIG. 7 shows the glancing angle X-ray diffraction (XRD) pattern of the deposited $In_2O_3$ according to the invention (see Example 3) deposited at 550° C. by aerosol assisted chemical vapour deposition (AACVD) using $In(OTf)_3$ in methanol.

Indium (III) triflate was used to deposit indium oxide thin films. Indium oxide films were deposited from $[In(OTf)_3]$ (0.25 g) in methanol (20 mL) by AACVD at a deposition temperature of 550° C. in a N2 carrier gas (0.6 $Lmin^{-1}$). Deposition of $In_2O_3$ was confirmed using XRD, as shown in FIG. 7. The films were visually transparent and had strong adhesion.

Example 4

Figure 8:
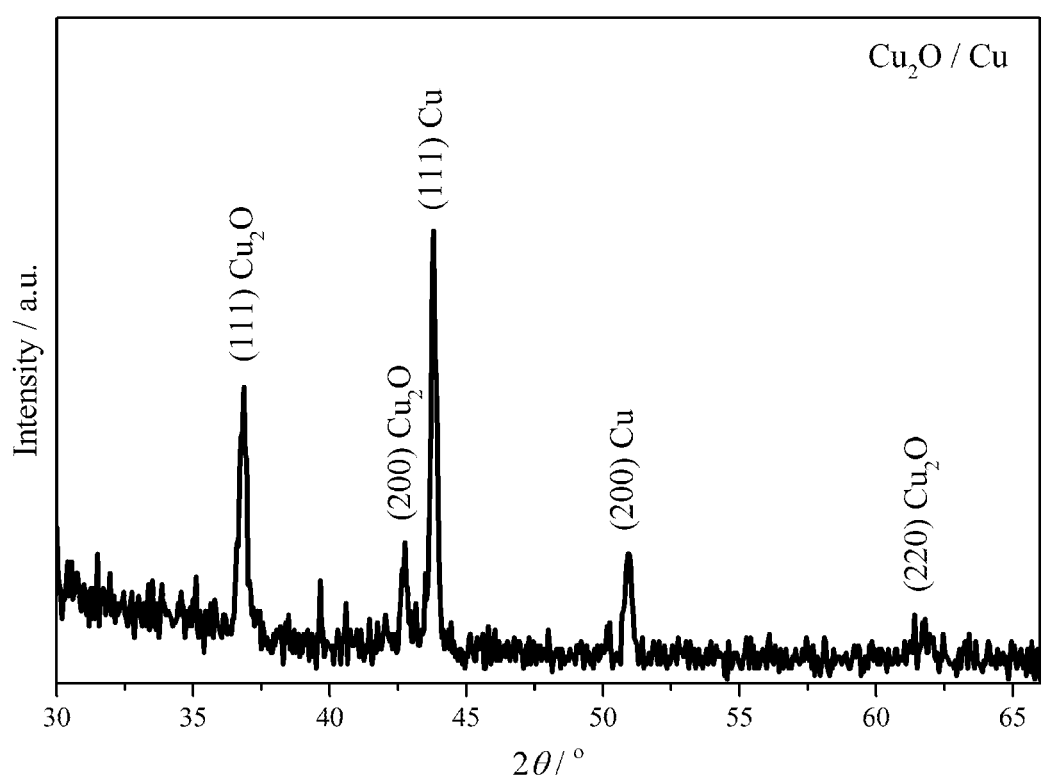
FIG. 8 shows the glancing angle X-ray diffraction (XRD) pattern of the deposited copper/copper oxide film according to the invention (see Example 4) deposited at 550° C. by aerosol assisted chemical vapour deposition (AACVD) using $Cu(OTf)_2$ in methanol.

Copper (II) Triflate was used to deposit films. AACVD of $[Cu(OTf)_2]$ (0.5 g) in methanol (30 mL) at a deposition temperature of 550° C. in an $N_2$ carrier gas (1 $Lmin^{-1}$) resulted in the deposition of a mixture of $Cu_2O$ and Cu metal, as confirmed by XRD shown in FIG. 8. The deposition of $Cu_2O$ and Cu is dependent on the deposition and post-deposition conditions employed, including presence of oxidant, amounts of oxidant and precursor in the precursor mixture and substrate temperature. The films exhibited good adhesion to the substrate and were deep green/orange in colour.

Example 5

Aluminium triflate was used to deposit films of alumina. AACVD of $[Al(OTf)_3]$ (0.5 g) in methanol (30 mL) at a deposition temperature of 550 and 600° C. in $N_2$ carrier gas (1 $Lmin^{-1}$) resulted in the deposition of amorphous white but transparent thin films.

XPS analysis of the deposited films confirmed the prescence of Al and O and were consistent with films of $Al_2O_3$ having been deposited. Peaks were observed for $Al^{3+}$ ($Al_2O_3$) at 75 eV and for $Al^{3+}$ ($Al_2O_3/Al$) at 77.2 eV and 80 eV binding energy respectively. The $O^{2-}$ peak attributable to $Al_2O_3$ is centered at around 532 eV.

Example 6

Figure 9:
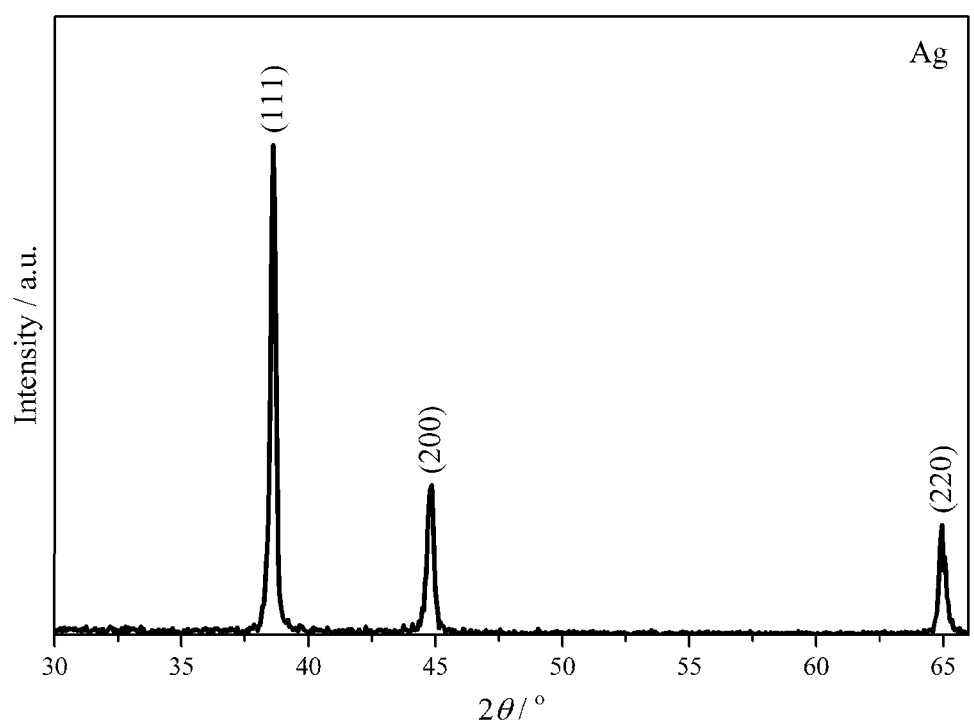
FIG. 9 shows the glancing angle X-ray diffraction (XRD) pattern of the deposited Ag film according to the invention (see Example 6) deposited at 550° C. by aerosol assisted chemical vapour deposition (AACVD) using Ag(OTf) in methanol.

Silver triflate was used to deposit films. AACVD of [AgOTf] (0.5 g) in methanol (30 mL) at a deposition temperature of 550° C. in an $N_2$ carrier gas (1 $Lmin^{-1}$) resulted in the deposition of Ag thin films with a reflective metallic appearance. The metallic nature of the films was confirmed by XRD, as shown in FIG. 9.

The invention claimed is:

1. A process for depositing a metal and/or a metal oxide on a glass substrate, the process comprising,
   providing a glass substrate having a surface,
   providing a precursor mixture comprising a metal sulfonate,
   at least partially atomizing the precursor mixture, and
   delivering the at least partially atomized precursor mixture to the surface of the glass substrate, wherein the surface of the glass substrate is at a substrate temperature above 500° C. at the time the precursor mixture is delivered to the surface and is sufficient to effect decomposition of the metal sulfonate.

2. The process as claimed in claim 1, wherein the metal, M, is selected from Zn, Mg, Al, Sb, Cu, Ag, Sn, and In.

3. The process as claimed in claim 1, wherein the metal sulfonate comprises a species of formula $M(O_3SR)_m$, wherein M is a metal, R is a $C_1$ to $C_7$ fluorinated or non-fluorinated hydrocarbyl group and m depends upon the oxidation state of M.

4. The process as claimed in claim 3, wherein R is $CF_3$, optionally wherein M is Zn or Mg and R is $CF_3$.

5. The process as claimed in claim 1, wherein the precursor mixture further comprises a carrier gas.

6. The process as claimed in claim 1, wherein the precursor mixture further comprises a solvent.

7. The process as claimed in claim 6, wherein the solvent comprises an oxygenated solvent.

8. The process as claimed in claim 7, wherein the solvent comprises a $C_1$ to $C_4$ alcohol.

9. The process as claimed in claim 1, wherein the precursor mixture further comprises an additional source of oxygen.

10. The process as claimed in claim 1, wherein the precursor mixture further comprises a source of a second metal.

11. The process as claimed in claim 10, wherein the source of a second metal comprises a source of aluminium, optionally wherein the source of a second metal comprises aluminium acetylacetonate.

12. The process as claimed in claim 10, wherein the molar ratio of the second metal to the metal of the metal sulfonate is in the range 0.01-0.2.

13. The process as claimed in claim 1, wherein the substrate temperature is in the range 500° C. to 700° C. at the time the precursor mixture is delivered to the surface.

14. The process as claimed in claim 1, wherein the metal oxide is deposited to a thickness in the range 400 nm to 700 nm.

15. The process as claimed in claim 1, wherein the substrate comprises soda lime silica glass.

16. The process as claimed in claim 15, wherein the substrate comprises a continuous ribbon of glass.

17. The process as claimed in claim 15, wherein the surface of the glass substrate comprises a layer comprising silicon oxide and the metal and/or metal oxide is deposited on the layer comprising silicon oxide.

18. A process for depositing a coating comprising an inorganic material selected from the group consisting of zinc oxide, aluminium oxide, copper oxide, copper metal, indium oxide, and silver metal on a glass substrate, the process comprising, providing a glass substrate having a surface, providing a precursor mixture comprising a metal trifluoromethanesulfonate, wherein the metal is selected from the group consisting of zinc, aluminium, copper, indium, and silver, and delivering the precursor mixture to the surface of the substrate, wherein the surface of the substrate is at a substrate temperature above 500° C. at the time the precursor mixture is delivered to the surface to effect decomposition of the metal trifluoromethanesulfonate.

19. The process as claimed in claim 7, wherein the solvent comprises methanol.

20. The process as claimed in claim 1, wherein the substrate temperature is in the range 500° C. to 700° C. at the time the precursor mixture is delivered to the surface.

21. The process as claimed in claim 1, wherein the metal oxide is deposited to a thickness in the range 450 nm to 600 nm.

22. The process as claimed in claim 15, wherein the substrate comprises a continuous ribbon of glass undergoing the float glass production process.

23. The process as claimed in claim 1, wherein the substrate temperature is above 550° C. at the time the precursor mixture is delivered to the surface.

24. The process as claimed in claim 18, wherein the substrate temperature is above 550° C. at the time the precursor mixture is delivered to the surface.

* * * * *